United States Patent
Peleg

(10) Patent No.: US 9,063,656 B2
(45) Date of Patent: Jun. 23, 2015

(54) SYSTEM AND METHODS FOR DIGEST-BASED STORAGE

(75) Inventor: Nir Peleg, Beer Yaakov (IL)

(73) Assignee: DELL GLOVAL B.V.—SINGAPORE BRANCH, Singapore (SG)

( * ) Notice: Subject to any disclaimer, the term of this patent is extended or adjusted under 35 U.S.C. 154(b) by 163 days.

(21) Appl. No.: 12/822,712

(22) Filed: Jun. 24, 2010
(Under 37 CFR 1.47)

(65) Prior Publication Data

US 2011/0320507 A1 Dec. 29, 2011

(51) Int. Cl.
*G06F 17/30* (2006.01)
*G06F 3/06* (2006.01)
*H03M 7/30* (2006.01)

(52) U.S. Cl.
CPC ............ *G06F 3/0608* (2013.01); *G06F 3/0641* (2013.01); *G06F 3/0673* (2013.01); *H03M 7/3091* (2013.01)

(58) Field of Classification Search
CPC .... G06F 3/0608; G06F 3/0673; G06F 3/0641
USPC .............................................. 707/822, E17.01
See application file for complete search history.

(56) References Cited

U.S. PATENT DOCUMENTS

| | | | | |
|---|---|---|---|---|
| 5,828,876 A | | 10/1998 | Fish et al. ...................... 395/601 |
| 5,938,775 A | * | 8/1999 | Damani et al. ................... 714/15 |
| 6,567,928 B1 | * | 5/2003 | Lyle et al. ......................... 714/15 |
| 7,231,662 B2 | | 6/2007 | Wissenbach ....................... 726/4 |
| 7,263,650 B2 | | 8/2007 | Keeler et al. .................. 714/769 |
| 7,434,017 B2 | | 10/2008 | Maruyama et al. ........... 711/165 |
| 7,539,709 B1 | | 5/2009 | Vengerov et al. .............. 707/204 |
| 7,567,188 B1 | | 7/2009 | Anglin et al. ...................... 341/63 |
| 8,032,498 B1 | * | 10/2011 | Armangau et al. ........... 707/690 |
| 2003/0135514 A1 | * | 7/2003 | Patel et al. ..................... 707/102 |
| 2003/0158863 A1 | * | 8/2003 | Haskin et al. ................. 707/200 |
| 2003/0158873 A1 | * | 8/2003 | Sawdon et al. ............... 707/204 |
| 2004/0088301 A1 | * | 5/2004 | Mahalingam et al. ........ 707/100 |
| 2004/0186859 A1 | * | 9/2004 | Butcher ......................... 707/200 |
| 2004/0240466 A1 | * | 12/2004 | Unitt et al. ..................... 370/461 |
| 2006/0218366 A1 | | 9/2006 | Fukuda et al. ................. 711/165 |
| 2007/0055834 A1 | | 3/2007 | Malkin .......................... 711/162 |
| 2008/0005141 A1 | | 1/2008 | Zheng et al. ................... 707/101 |
| 2008/0005201 A1 | | 1/2008 | Ting et al. ...................... 707/204 |
| 2009/0070382 A1 | | 3/2009 | Agrawal et al. ............... 707/200 |
| 2009/0089483 A1 | | 4/2009 | Tanaka et al. ................. 711/103 |
| 2009/0132619 A1 | | 5/2009 | Arakawa et al. .............. 707/205 |
| 2009/0164530 A1 | | 6/2009 | Gilpin et al. .................. 707/204 |
| 2009/0182785 A1 | | 7/2009 | Aston et al. ................... 707/203 |
| 2010/0077013 A1 | * | 3/2010 | Clements et al. ............. 707/822 |
| 2010/0091676 A1 | * | 4/2010 | Moran et al. .................. 370/252 |

OTHER PUBLICATIONS

Quinlan, S and Dorward S., "Venti: a new approach to archival storage", Proceedings of the FAST 2002 Conference on File and Storage technolgies, Montery, CA, USA, Jan. 28-30, 2002, 14 Pages.
Fu, K. et al., Fast and secure distributed read-only file system:, Proceedings of the 4th Symposium on Operating Systems Design & Implementation (OSDI 2000), San Diego, CA, Oct. 2000, 22 pages.

\* cited by examiner

*Primary Examiner* — Shiow-Jy Fan
(74) *Attorney, Agent, or Firm* — Baker Botts L.L.P.

(57) ABSTRACT

A system comprising a file system that manages files and directories. A digest-based block storage engine coupled to the file system generates a digest when performing saving and retrieving operations initiated by the file system. The engine counts references to data blocks and a list of free data blocks. A storage unit may be coupled to the engine, wherein the storage unit stores a plurality of data blocks.

19 Claims, 2 Drawing Sheets

*FIG 3A*
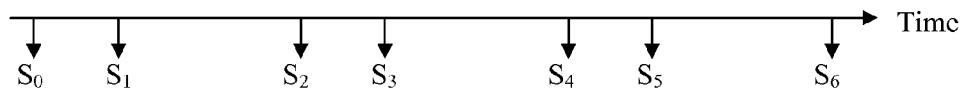
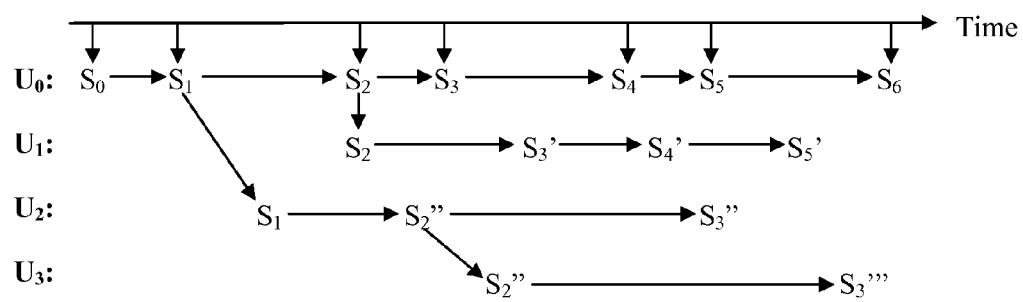
*FIG 3B*
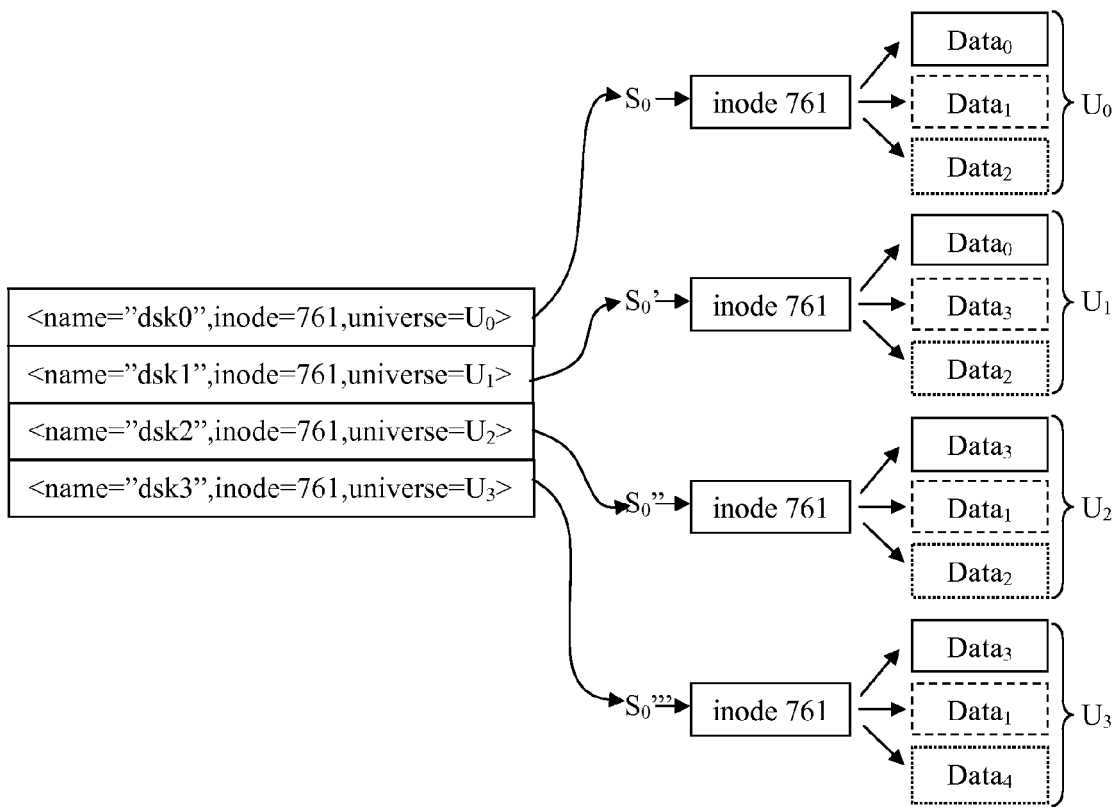
*FIG 4*

SYSTEM AND METHODS FOR DIGEST-BASED STORAGE

TECHNICAL FIELD

The disclosure generally relates to data storage systems and more particularly to multiple tiered data storage systems.

BACKGROUND

Data storage systems are widely used in computer system whether locally or distributed. The demand for an ever increasing amount of storage is well known as well as the need to enable security, reliability and dependability of such systems. Certain of the factors that enable solving one problem cause greater problems in other areas important to the users of data storage. For example, in multi-tiered storage systems adding tiers poses potential problems when data is shared among objects residing in different tiers. On the other hand, de-duplication (dedupe) and writable snapshots are related and allow multiple instances of writable objects to share blocks of data of extents of data.

A plurality of related art solutions address issues relating to dedupe and storage tiers. However, there are remaining challenges to overcome that have to do with overall system operability, scalability, and dependability. It is especially important that while avoiding unnecessary duplication, it remains possible to address the ability to return to a desired state of the system to enable progress from a desired state of the storage system. However, it is also essential not to impact other users of the storage and maintain the system integrity.

Therefore, in view of the limitations of the prior art it would be advantageous to provide a system and methods thereto that overcome some of the limitations discussed above.

SUMMARY

To obtain some of the advantages discussed above, there is provided a system comprising a file system that manages files and directories. A digest-based block storage engine coupled to the file system generates a digest when performing saving and retrieving operations initiated by the file system. The engine counts references to data blocks and a list of free data blocks. A storage unit coupled to the engine, the storage unit stores a plurality of data blocks.

In another specific enhancement, the digest is based on a value calculated by applying a strong hash function to a data block.

In another specific enhancement, a data block of said data blocks is one of: fixed size, variable size.

In another specific enhancement, the engine returns a digest responsive of successfully performing the saving operation initiated by the file system.

In another specific enhancement, the engine returns data retrieved from the storage unit responsive of successfully performing the retrieving operation initiated by the file system.

In another specific enhancement, the engine is operative in at least one of three modes: unlogged, perpetual log, and log on demand.

In another specific enhancement, at the unlogged mode replaced digests have their reference count decremented.

In another specific enhancement, blocks that have become unreferenced are freed.

In another specific enhancement, at the perpetual log mode each superblock digest update is logged.

In another specific enhancement, at the log on demand mode superblock digests are logged upon demand and unlogged superblocks are removed from the system.

In another specific enhancement, the engine enables access to snapshots made to superblock digests in a first time axis.

In another specific enhancement, the engine enables the creation of a second time axis stemming from a snapshot of a superblock digest made in the first time axis.

In another specific enhancement, the engine enables access to snapshots made to superblock digests in the second time axis.

In another specific enhancement, the engine enables access to snapshots made to superblock digests in the first time axis provided that such snapshots are from the stemming snapshot and there before.

In another specific enhancement, a directory of the file system comprises a time axis identification in addition to its data and inode information.

Another aspect of the disclosed teachings is a system comprising a file system for management of files and directories. a digest-based block storage engine coupled to the file system that generates a digest when performing saving and retrieving operations initiated by the file system, the engine counts references to data blocks and a list of free data blocks. A storage unit is coupled to the engine, the storage storing a plurality of data blocks. The engine periodically takes snapshots of digests of superblocks over a first time axis.

Another aspect of the disclosed teachings is a method of operation of a digest-based storage engine comprising receiving from a file system an instruction to store data. A digest is generated using a digest-based block storage engine coupled to the file system. The data is stored in a form of a plurality of data blocks.

Another aspect of the disclosed teachings is a method of operation of a digest-based storage engine comprising receiving from a file system an instruction to retrieve data. The blocks of data in a storage unit corresponding to the instruction are accessed by using a digest generated by a digest based storage unit.

BRIEF DESCRIPTION OF THE DRAWINGS

The disclosed teachings will become more apparent by describing in detail examples and embodiments thereof with reference to the attached drawings in which:

FIG. 3A—is an example of a one-dimensional time axis of superblock digests.

FIG. 3B—is a multi-universe superblock digest in accordance according to an exemplary implementation of the disclosed teachings.

FIG. 4—is a block diagram of writeable snapshots using meta-directories.

DETAILED DESCRIPTION

As an example of the disclosed teachings, a system and methods thereof for a digest-based data storage system are shown. The system comprises a file system, a digest-based storage engine and a storage unit. It should be understood that an example of a digest is a value calculated by applying a strong hash function to a data block. A cryptographic hash function is a deterministic procedure that takes an arbitrary block of data and returns a fixed-size bit string, the (cryptographic) hash value, such that an accidental or intentional change to the data will change the hash value. A good hash function should be easy to compute the hash value for any given message. It should not be able to find a message that has a given hash, to modify a message without changing its hash or to find two different messages with the same hash. As should be well-known, there are many possible such hash functions.

The digest based storage engine generates and uses a digest when performing saving and retrieval operations initiated by the file system. A retrieval operation is performed by providing the digest and retrieving the respective stored data. In accordance with the disclosed teachings, a plurality of universes of snapshots of superblock digests are maintained thereby enabling writable snapshots as modifications in each universe are performed independently of any other universe.

Figure 1:
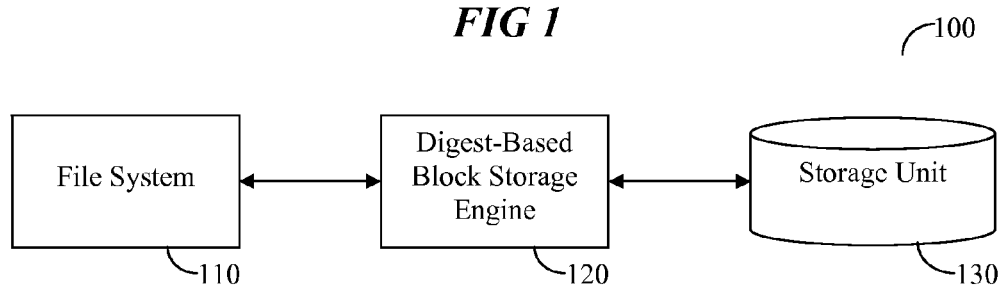
FIG. 1—is a block diagram of a storage system in accordance with an exemplary implementation of the disclosed teachings.

Reference is now made to the exemplary and non-limiting FIG. 1 that depicts a block diagram of a storage system 100 in accordance with the disclosure. The file system 110 is a file system, distributed or local, that is capable of saving and retrieving data it was requested to handle. In a typical embodiment, the file system is used by an operating system (OS) (not shown) for the purpose of performing these duties. In a typical prior art system the file system 110 would interact directly with the storage unit 130. According to the disclosed teachings, a digest-based block storage engine 120, is added between the file system 110 and the storage 130. Digests created by engine 120 replace all block addresses provided by the file system to the engine 120. The engine 120 maintains a reference count for each block as well as a list of the free blocks of the storage 130. The file system 110, in accordance with the disclosed teachings, stores digests instead of block addresses, therefore there is also a need to handle differently write-in-place operations. The engine 120, when saving data to the storage unit 130 returns a digest upon success. The engine 120, when retrieving data from the storage unit 130 returns the data referenced to by the digest.

The saving operation as per the disclosed teachings comprises the following:

Store<flags, old digest, new digest, data>

The flags of the operation provide indication respective of the construct type being stored, for example, and without limitations, data, metadata or superblock. The old digest is optional, and when present indicates that the data to be stored, and provided therein, is to replace existing data referenced by the old digest. The new digest is optionally supplied by the file system 110; if omitted, then engine 120 calculates a digest from the data, if such data is present. In the case where data is not present then only the reference count increases assuming the new digest has already existed; otherwise, an error indication is provided. It should be noted that omission of both new digest and data may be an indication to dispose of the data referenced to by the old digest, i.e., replacement with nothing. The Store command returns a new digest upon success.

Figure 2:
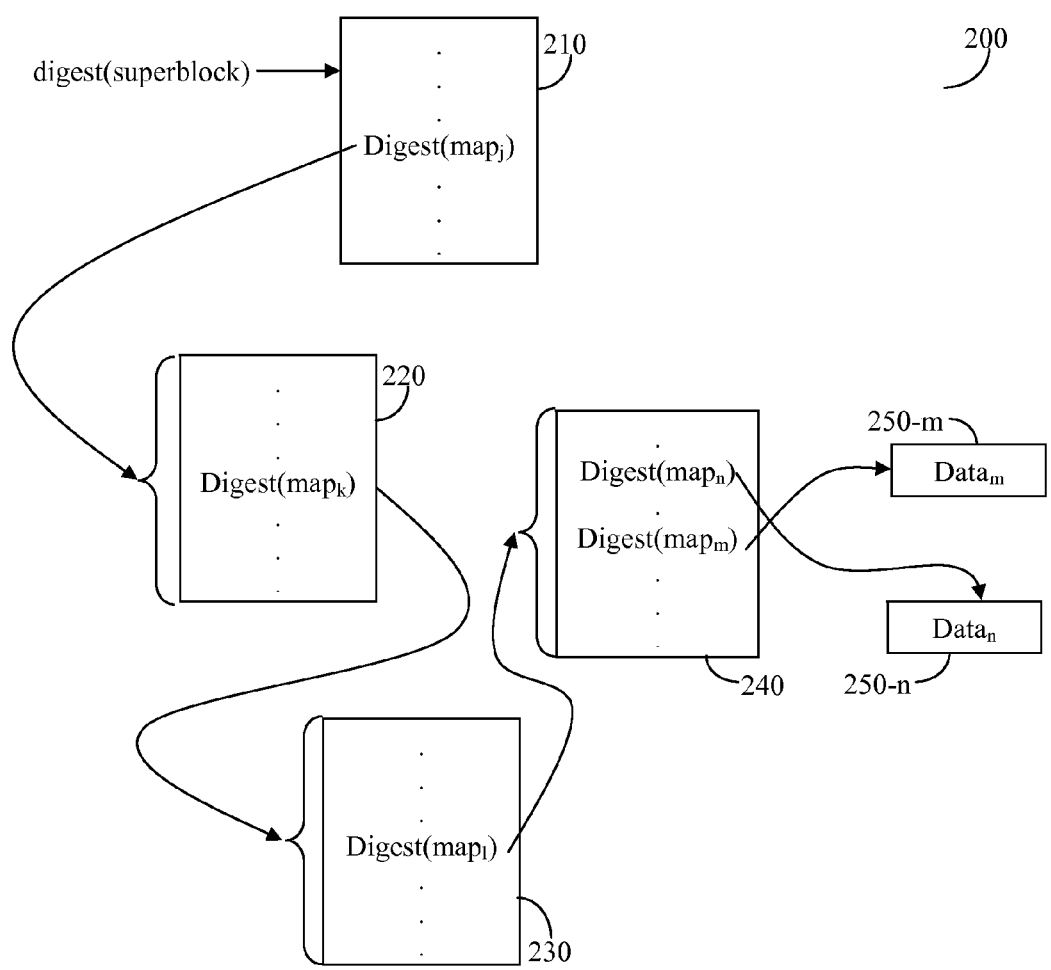
FIG. 2—is a diagram of addressing a data block according to an exemplary implementation of the disclosed teachings.

The operation of the engine 120 is further described with respect to FIG. 2, where an exemplary and non-limiting diagram 200 shows the addressing a data block according to the principles of the disclosure. Writing to a block, for example block 250-$n$, results in a digest in map$_n$ 240. It should be now also understood that the digest may be composed from a plurality of mapping levels and hence the digest of map$_n$ 240 may further generate a digest such as the digest in map$_1$ 230 and further a digest in map$_k$ 220. The reference then goes back to a digest in the superblock 210 that is referenced by digest (superblock) by the file system 110. It should be noted that the number of levels of the digest may vary and is not limiting upon the disclosure. In accordance with the disclosure a new superblock digest is always generated with, optionally, the possibility of coalescing, resulting from a plurality of operations occurring in parallel and changing the same superblock. The logging of a digest of a superblock allows for access to system images as of the time the digest was taken, and for as long as the respective block has not been freed. There are several possible embodiments of operation for the digests in accordance with the disclosure. The digests can be unlogged, i.e., replaced digests have their respective counter decremented. Respective unreferenced blocks are freed and therefore there is no access to images of past times. In another mode of operation logging is perpetual, i.e., a digest of a superblock is always logged. This enables perpetual data access to past images. An in between mode of log on demand allows for different superblock digests to either be logged or unlogged based on a preference or configuration. For the operation of the engine 120 a reference count is kept on a per superblock basis. In the unlogged mode each replace operation decrements the respective reference counter. In the perpetual logging mode no modification of the counter is made. Hence, logged can be either reclaimed or removed by recursively decrementing the reference counts of all digests that are rooted at an old superblock. By deleting or otherwise omitting the superblock digest the entire reference is deleted. In one embodiment of the disclosure this operation may be disabled for various volumes of the file system.

The use of superblocks enables access to past images of the file system and are ordered in a one-dimensional time axis. A non-limiting example is shown in FIG. 3A. Digests $S_0$ through $S_6$ are taken at various points in time. This in a sense represents a single universe in which it is possible to move along the time axis and access earlier digests of the superblock. Reference is now made to FIG. 3B where a multi-universe operation of the superblock digest is shown. While in the initial universe $U_0$ there are still shown snapshots digests $S_0$ through $S_6$, it is possible to create parallel universes stemming away from the initial universe. For example, at a time that may or may not differ from the creation of $S_2$, a new universe $U_1$ is created that begins with the snapshot digest $S_2$ and then continues to develop its own universe with snapshot digests $S_3'$ through $S_5'$ at its own timeline. An entity residing in $U_1$ may use the past images that belong to its universe as well as universes that have created it prior to the time of creation. That is, in universe $U_1$, it is possible to go back to the past image $S_1$ in universe $U_0$ but it is not possible to go to $S_3$ of universe $U_0$. In another example it is seen that a universe $U_2$ that split from universe $U_0$ may further split into universe U3 creating a new track of superblock digest snapshots. In the case of $U_3$ it may be possible to move from $S_3'''$ to $U_2$ and then to universe $U_0$. The multiple universes have parallel time axes with each universe being addressed by a fixed identifier. Current art implementations of directories of a file system store names and inode numbers, i.e., each directory entity consists of <inode, name>. The inode is a global file identifier that is independent of the file hierarchy. In according with the principles of the disclosure a universe id (uid) is added to each directory. The new directory entity now will consist of <uid, inode, name>. A person skilled in the art will appreciate that as modification in each of the universes is independent of each other there has been created a writable snapshot system. This is further shown with respect of FIG. 4 which depicts exemplary and non-limiting writeable snapshots using meta-directories in accordance with the principles of the disclosure. The data is inherently shared while individual updates are separately applied to each of the universes, in this case universes $U_0$ through $U_3$. The dedupe operation takes place among multiple universes and copies.

The disclosed teachings implemented in hardware, firmware, software or any combination thereof. Moreover, the software is preferably implemented as an application program tangibly embodied on a program storage unit or computer readable medium. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown. In addition, various other peripheral units may be connected to the computer platform such as an additional data storage unit and a printing unit.

All examples and conditional language recited herein are intended for pedagogical purposes to aid the reader in understanding the principles of the disclosure and the concepts contributed by the inventor to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Other modifications and variations to the disclosure will be apparent to those skilled in the art from the foregoing disclosure and teachings. Thus, while only certain embodiments of the disclosure have been specifically described herein, it will be apparent that numerous modifications may be made thereto without departing from the spirit and scope of the disclosure.

What is claimed is:

1. A system for digest-based storage, comprising:
   a processor communicatively coupled to a memory;
   a file system configured to manage files and directories;
   a digest-based block storage engine coupled to the file system, comprising instructions resident on the memory for execution by the processor, the instructions, when executed, causing the engine to be configured to:
   generate a superblock digest when performing saving;
   retrieve operations initiated by the file system; and
   count references to data blocks and a list of free data blocks; and
   a storage unit coupled to the engine and configured to store a plurality of data blocks;
   wherein the engine is configured to:
   free blocks that have become unreferenced;
   operate in a perpetual log mode, an unlogged mode, and a log on demand mode, wherein the engine is configured to operate in a single one of the perpetual log mode, the unlogged mode, and the log on demand mode at a time with respect to a given volume of the file system; and
   select between the unlogged mode, perpetual log mode, and log on demand mode;
   decrement a count of references of unlogged mode replaced digests for a replace operation in the unlogged mode;
   in the perpetual log mode:
   maintain the count of references; and
   log each superblock digest update; and
   in the log on demand mode:
   log or unlog superblock digests based upon respective configuration of the superblock digests; and
   log superblock digests upon demand and remove unlogged superblocks from the system.

2. The system of claim 1, wherein the digest is based on a value calculated by applying a strong hash function to a data block.

3. The system of claim 1, wherein a data block of said data blocks is one of a fixed size and a variable size.

4. The system of claim 1, wherein the engine is configured to return a digest responsive of successfully performing the saving operation initiated by the file system.

5. The system of claim 1, wherein the engine is configured to return data retrieved from the storage unit responsive of successfully performing the retrieving operation initiated by the file system.

6. The system of claim 1, wherein the engine is configured to enable access to snapshots made to superblock digests in a first time axis.

7. The system of claim 6, wherein the engine is configured to enable the creation of a second time axis stemming from a snapshot of a superblock digest made in the first time axis.

8. The system of claim 7, wherein the engine is configured to enable access to snapshots made to superblock digests in the second time axis.

9. The system of claim 8, wherein the engine is configured to enable access to snapshots made to superblock digests in the first time axis provided that such snapshots are from the stemming snapshot and there before.

10. The system of claim 9, wherein a directory of the file system comprises a time axis identification, its data, and its inode information.

11. A system for accessing past images of digest-based file systems, comprising:
    a processor communicatively coupled to a memory;
    a file system configured to manage files and directories;
    a digest-based block storage engine coupled to the file system, comprising instructions resident on the memory for execution by the processor, the instructions, when executed, causing the engine to be configured to:
    generate a superblock digest when performing saving and retrieving operations initiated by the file system;
    count references to data blocks and a list of free data blocks;
    periodically take snapshots of superblock digests over a first time axis;
    enable the creation of a second time axis stemming from a snapshot of a superblock digest made in the first time axis; and
    enable access to snapshots made to superblock digests in the second time axis;
    and
    a storage unit coupled to the engine, the storage unit configured to store a plurality of data blocks;
    wherein the engine is further configured to:
    operate in a perpetual log mode, an unlogged mode, and a log on demand mode, wherein the engine is configured to operate in a single one of the perpetual log mode, the unlogged mode, and the log on demand mode at a time with respect to a given volume of the file system; and
    select between the unlogged mode, perpetual log mode, and log on demand mode;

decrement a count of references for a replace operation in the unlogged mode;
maintain the count of references in the perpetual log mode; and
log or unlog superblock digests based upon respective configuration of the superblock digests.

12. The system of claim 11, wherein the superblock digest is based on a value calculated by applying a strong hash function to a data block.

13. The system of claim 11, wherein a data block of said data blocks is one of a fixed size and a variable size.

14. The system of claim 11, wherein the engine is configured to enable access to snapshots made to superblock digests in the first time axis provided that such snapshots are from the stemming snapshot and there before.

15. The system of claim 14, wherein a directory of the file system comprises a time axis identification, its data, and its inode information.

16. A method of operation of a digest-based storage engine comprising:
    using a computing system, receiving from a file system an instruction to store data;
    using the computing system, generating a superblock digest using a digest-based block storage engine coupled to the file system; and
    using the computing system and the digest-based block storage engine to:
        store the data in a form of a plurality of data block;
        count references to data blocks and a list of free data blocks;
        periodically take snapshots of superblock digests over a first time axis;
        enable the creation of a second time axis stemming from a snapshot of a superblock digest made in the first time axis; and
        enable access to snapshots made to superblock digests in the second time axis;
        operate in a perpetual log mode, an unlogged mode, and a log on demand mode;
        select between the unlogged mode, perpetual log mode, and log on demand mode;
        decrement a count of references for a replace operation in the unlogged mode;
        maintain the count of references in the perpetual log mode; and
        log or unlog superblock digests based upon respective configuration of the superblock digests in the log on demand mode.

17. The method of claim 16, wherein the superblock digest is based on a value calculated by applying a strong hash function to a data block.

18. A method of operation of a digest-based storage engine comprising:
    using a computing system, receiving from a file system an instruction to retrieve data; and
    using the computing system, accessing the blocks of data in a storage unit corresponding to the instruction by using a superblock digest generated by a digest based storage unit;
    operating at various times in a perpetual log mode, an unlogged mode, and a log on demand mode, including operating in a single one of the perpetual log mode, the unlogged mode, and the log on demand mode at a time with respect to a given volume of the file system;
    freeing blocks that have become unreferenced;
    selecting between the unlogged mode, perpetual log mode, and log on demand mode;
    decrementing a count of references of unlogged mode replaced digests for a replace operation in the unlogged mode;
    in the perpetual log mode:
        maintaining the count of references in the perpetual log mode; and
        logging each superblock digest update; and
    in the log on demand mode:
        logging or unlogging superblock digests based upon respective configuration of the superblock digests;
        logging superblock digests upon demand and removing unlogged superblocks from the system.

19. The method of claim 18, wherein the superblock digest is based on a value calculated by applying a strong hash function to a data block.

* * * * *